(12) United States Patent
Wilson

(10) Patent No.: US 10,404,505 B1
(45) Date of Patent: Sep. 3, 2019

(54) BUS-INVERT CODING WITH RESTRICTED WEIGHT RANGE FOR MULTI-LEVEL SIGNALING

(71) Applicant: NVIDIA Corp., Santa Clara, CA (US)

(72) Inventor: John Wilson, Wake Forest, NC (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 16/172,489

(22) Filed: Oct. 26, 2018

Related U.S. Application Data

(60) Provisional application No. 62/669,581, filed on May 10, 2018.

(51) Int. Cl.
*H04L 27/04* (2006.01)
*H03K 19/177* (2006.01)
*H04N 19/184* (2014.01)

(52) U.S. Cl.
CPC ....... *H04L 27/04* (2013.01); *H03K 19/17724* (2013.01); *H04N 19/184* (2014.11)

(58) Field of Classification Search
CPC .................. H04L 27/02; H04L 27/04
USPC .......................... 375/353; 332/115
See application file for complete search history.

(56) References Cited

U.S. PATENT DOCUMENTS

2006/0139186 A1\* 6/2006 Hoyer ............... H04L 25/4908
  341/50
2016/0013958 A1\* 1/2016 Mishra ............... H04L 25/06
  375/287

\* cited by examiner

*Primary Examiner* — Kevin Kim
(74) *Attorney, Agent, or Firm* — Rowan TELS LLC

(57) ABSTRACT

A system comprising a PAM-4 transmitter coupled data lanes includes a least significant bit section and a most significant bit section for the symbols generated on each lane. A controller to determine a state of the PAM-4 transmitter and selectively inverts a polarity of the symbol bits on the lanes based on the state.

20 Claims, 16 Drawing Sheets

| BUS VALUE 402 | | | | | | | | | WEIGHT 404 |
|----|----|----|----|----|----|----|----|----|----|
| D0 | D1 | D2 | D3 | D4 | D5 | D6 | D7 | W |
| 0 | 0 | 0 | 0 | 0 | 0 | 0 | 0 | 0 |
| 1 | 0 | 0 | 0 | 0 | 0 | 0 | 0 | 1 |
| 1 | 1 | 0 | 0 | 0 | 0 | 0 | 0 | 2 |
| 1 | 1 | 1 | 0 | 0 | 0 | 0 | 0 | 3 |
| 1 | 1 | 1 | 1 | 0 | 0 | 0 | 0 | 4 |
| 1 | 1 | 1 | 1 | 1 | 0 | 0 | 0 | 5 |
| 1 | 1 | 1 | 1 | 1 | 1 | 0 | 0 | 6 |
| 1 | 1 | 1 | 1 | 1 | 1 | 1 | 0 | 7 |
| 1 | 1 | 1 | 1 | 1 | 1 | 1 | 1 | 8 |

FIG. 4

PAM-4 SIGNALING 802

PAM-2 SIGNALING 804

BUS-INVERT CODING WITH RESTRICTED WEIGHT RANGE FOR MULTI-LEVEL SIGNALING

CROSS-REFERENCE TO RELATED APPLICATIONS

This application claims benefit under 35 U.S.C. 119(e) to U.S. application Ser. No. 62/669,581, entitled "Bus-Invert Coding with Restricted Weight Range for Multi-Level Signaling", filed on May 10, 2018, and incorporated herein by reference in its entirety.

BACKGROUND

Parallel single-ended buses suffer from high amounts of self-induced noise. This noise occurs from the simultaneous switching of outputs (SSO). The noise is also referred to as SSO noise of simultaneous switching noise (SSN). The noise causes the power supply that circuits operate from to droop and/or overshoot, depending on the di/dt (current switching rate) and the impedance of the power delivery network (PDN). This modulation of the power supply voltage causes circuits to speed-up and slow-down, which reduces timing margins. The noise also couples onto the signals being transmitted and reference voltages, thereby reducing voltage margin.

To reduce the maximum di/dt of a group of wires, the weight of this group of conductors or lanes is monitored, and then an extra signal is introduced that encodes the (logical) polarity of this group of lanes. This is known as "low-weight" bus-invert coding. This form of bus-invert coding reduces the maximum di/dt for a group of lanes by up to 50% and their average current consumption by 18%. It applies where each lane in the group consumes no current for one of the output logic levels (e.g., "0") and a finite amount of direct current for the other output logic level (e.g., "1"). An example of how the industry uses "low-weight" encoding is in graphics memory interfaces (GDDR) where it is referred to as DBI-DC coding. Implementing DBI-DC requires that an extra bit (i.e., lane) be added to the group of lanes.

BRIEF SUMMARY

A technique is disclosed that reduces the maximum di/dt over conventional approaches for multi-PAM single-ended signaling. The self-induced noise may be reduced, for example, on the power supply of a graphics processing unit (GPU), central processing unit (CPU), and a dynamic random-access memory (DRAM) device. Instead of independently encoding the most significant bits (MSBs) and least significant bits (LSBs) of a PAM-4 single-ended parallel bus, the system identifies and utilizes interactions between the MSBs and the LSBs to further reduce the worst-case di/dt for the entire multi-level signaling system.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 4 illustrates an embodiment of a bus values and weights without low-weight encoding 400.

DETAILED DESCRIPTION

Conventional solutions reduce the worst-case di/dt by 50%, whereas the disclosed technique reduces the worst-case di/dt by 67%. The technique may be utilized with receivers/devices that are designed for more conventional encoding techniques, to further reduce power supply noise. With PAM-4 signaling the disclosed technique has greater utility than for PAM-2, because the signal amplitude for PAM-4 is 3× smaller, thus increasing the efficiency of a device utilizing the new technique.

Figure 1:
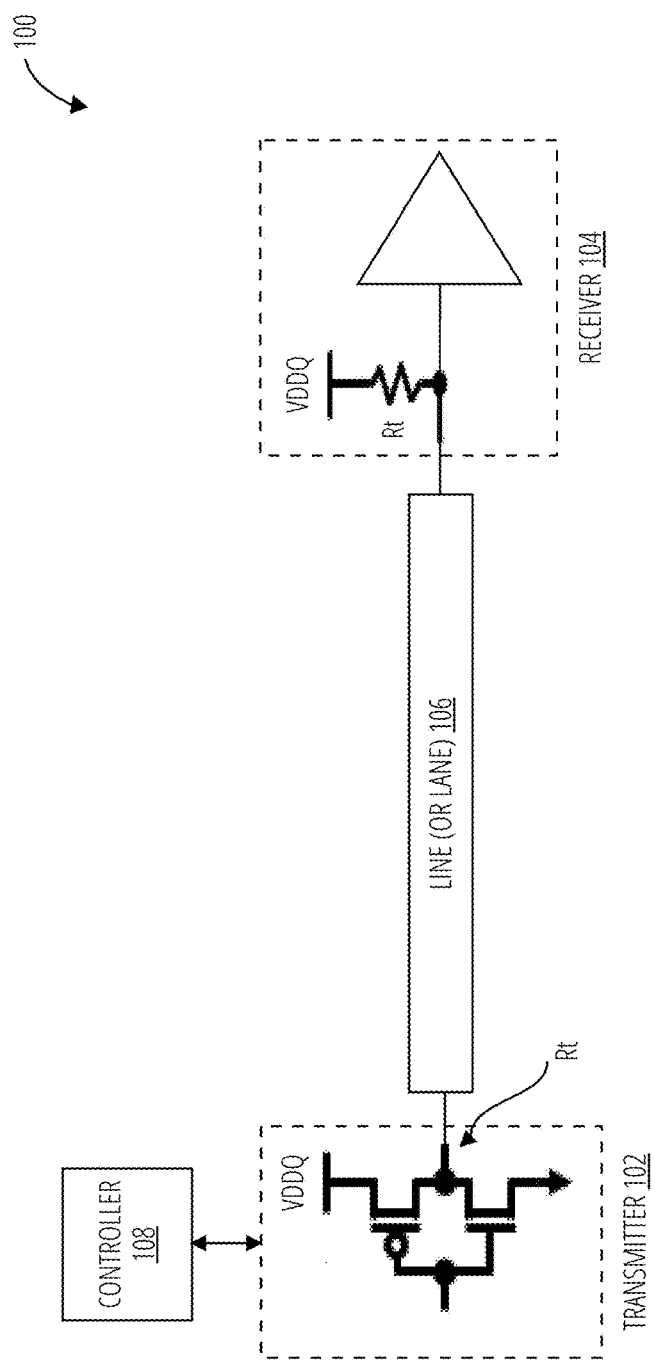
FIG. 1-3 illustrate an embodiment of a pseudo-open drain driver and receive termination 100.
Figure 2:
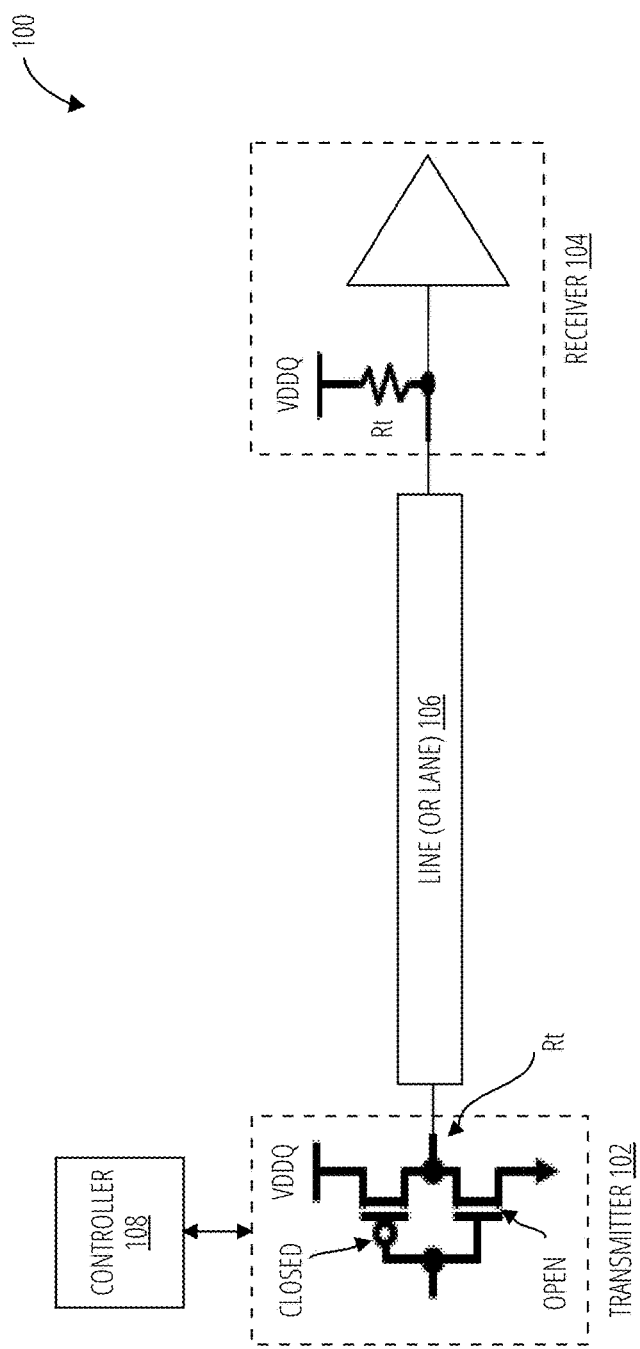
Figure 3:
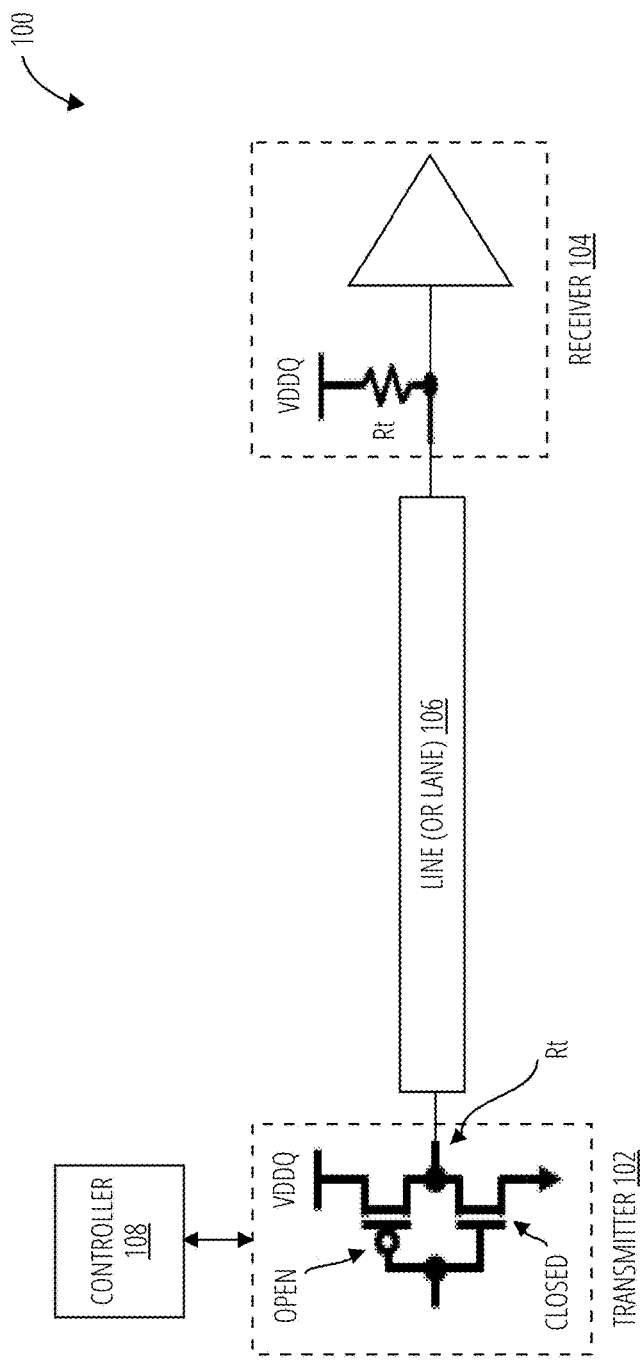

Referring to FIG. 1-FIG. 3, a pseudo-open drain (POD) driver and receive termination 100 comprises a transmitter 102, a receiver 104, a line 106, and a controller 108. The example shown in FIG. 1 is representative of a pseudo-open drain driver and receive termination 100 used in graphics memory interfaces.

The transmitter 102 may be an inverter designed to have an output impedance ($R_T$) of 40Ω, when driving a Logic LO or HI onto the line 106. The receiver 104 of the link is terminated with a 40Ω resistor ($R_T$) connected to the positive power supply ($V_{DDQ}$), which may for example be 1.2 V, and which may be the same power supply used by the output stage that operates the transmitter 102. When the transmitter 102 drives a logic HI onto the line, as depicted in FIG. 2, the DC current drawn from the $V_{DDQ}$ power supply through $R_T$ at the receiver 104 is 0 mA. However, when the transmitter drives a Logic LO onto the line, as depicted in FIG. 3, the DC current drawn from the $V_{DDQ}$ power supply through $R_T$ at the receiver 104 is 15 mA. In a typical parallel bus, several bits may be grouped together, and in many cases the grouping is in sets of 8 lanes. In this example, depending on the values output by the transmitter, the group of 8 lanes may then draw anywhere from 0 mA to 120 mA (15 mA/lane×8 lanes=120 mA maximum) from the $V_{DDQ}$ power supply. A maximum di/dt occurs when the group of 8 lanes transitions from sending 8 logic HI states to sending 8 Logic LO states—the current draw switches from 0 mA to 120 mA. This di/dt generates noise in the power supply.

The total number of current-consuming states is referred to as the "weight" of the bus, the "bus weight", or just the "weight". In other words, the "weight" of the bus, or group of 8 lanes in this example, ranges from 0-to-N, where N is the total number of current consuming Logic LO states for the group of 8 lanes.

"Low-weight" encoding may reduce the maximum di/dt of the group of 8 lanes by 50% at the cost of adding an extra lane to the group, for a total of 9 lanes. The logical polarity of the 8 lanes is encoded by the 9$^{th}$ lane, referred to as the data bus inverse (DBI) bit (as this may be utilized for data buses, though not limited to data buses). By encoding the polarity of the 8 lanes, with the polarity of the 9$^{th}$ lane, the range of weights for the group of 9 lanes reduces to 0-to-N/2, where N is the total number of current consuming Logic LO states for the group of 9 lanes.

Figure 5:
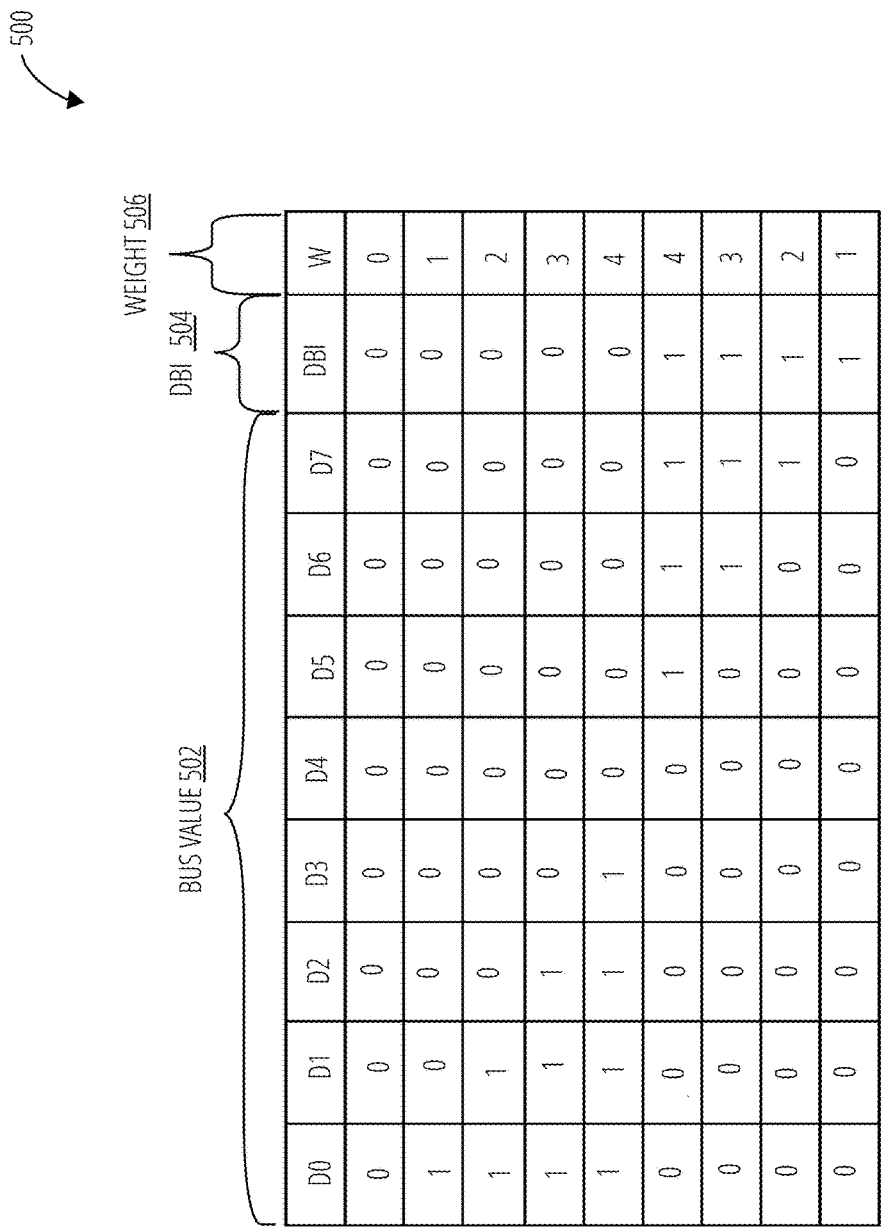
FIG. 5 illustrates an embodiment of a bus values and weights with low-weight encoding 500.

The controller 108 may determine whether to invert the bus bits. First, a weight of 1 is equated to the state that consumes current, which in this example is a Logic LO on the line (as depicted in FIG. 3). The voltage on the line 106 need not be observed; the current flowing from $V_{DDQ}$ and through the line 106 is observed and a binary value of 1 is assigned to this 15 mA current even though the logical value of the voltage on the line is 0. For each lane in the group that consumes current (15 mA per-lane or per-bit in this example), a weight of 1 is added to the total bus weight. When the bus weight exceeds N/2 (4 in this example where N=8), the DBI bit changes its state to consume current and the polarity of all bus bits are inverted. That is, the lanes that previously consumed current do not consume current now. However, the bus bits that previously did not consume current now consume current. This encoding is done by recognizing that whenever more than N/2 of the bus bits are going to consume current, the DBI bit is activated and the polarity of all the bus bits is inverted. The bus values and weights are for an 8-bit bus without and with "low-weight" encoding are depicted in FIG. 4 and FIG. 5, respectively.

Bus values and weights without low-weight encoding (400) are shown in FIG. 4. These include a bus value 402 and a weight 404. Bus values and weights with low-weight encoding (500) are shown in FIG. 5. These include a bus value 502, a data bus invert bit 504, and a weight 506. In this example when the bus value 402 or bus value 502 has a value of "0" it indicates a non-current-consuming state for the corresponding lane (D0-D7), while a value of "1" indicates a current consuming state for the lane. The weight 404 is the sum of the bus value 402 for all the data lanes, and the weight 506 is the sum of the bus value 502 for all the data lanes and the data bus invert bit 504. The data bus invert bit 504 conveys whether the polarity of the bus bits should be inverted or not. When the weight 506 would be greater than N/2 (in this example, a value of 4), the data bus invert bit 504 is set to "1" and the bus value 502 are inverted, thus changing the weight 506 to a new, lower value. For example, D0-D6 may be in the "1" state, which would result in a weight 506 of "7." As "7">"N/2" (i.e., "4"), the data bus invert bit 504 is set to "1" from "0". This inverts D0-D6 to "0" and D7 to "1" from "0". The resulting weight 506 is thus "2", instead of "7".

Figure 6:
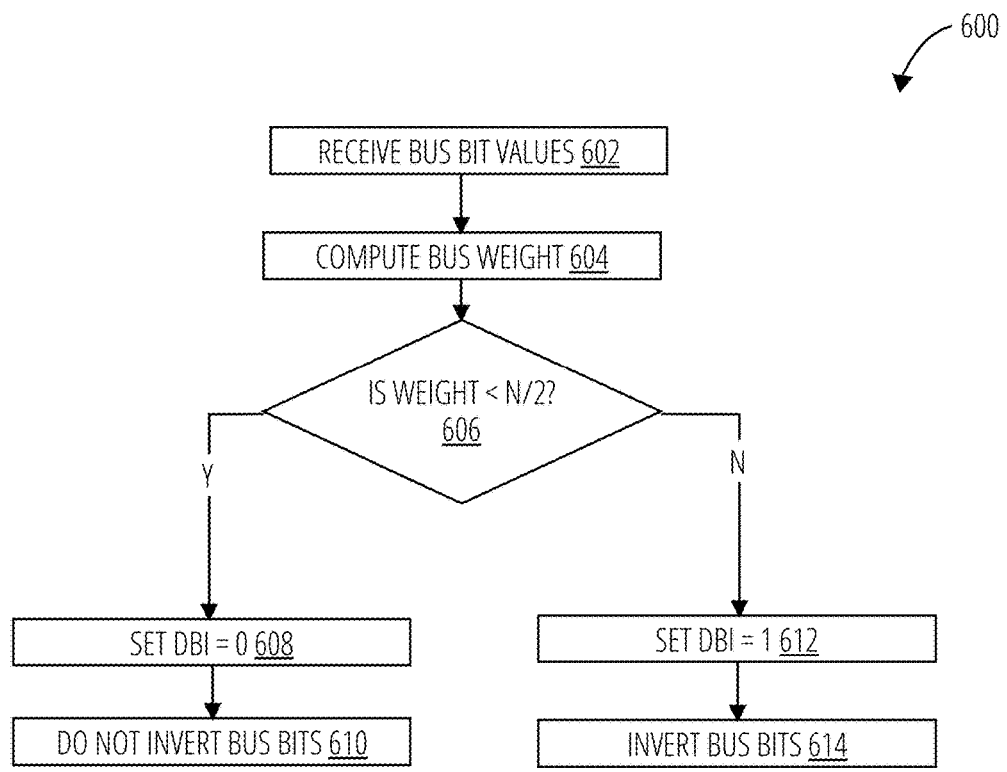
FIG. 6 illustrates an embodiment of a bus-invert coding method 600.

Referring to FIG. 6, a bus-invert coding method 600 receives the bus bit values for each lane (block 602). A bus bit value of "0" may indicate a non-current-consuming state, while a bus bit value of "1" may indicate a current-consuming state. The bus weight is then computed from the bus bit values (block 604). The bus weight may be the sum of the lanes in a current-consuming state. The bus-invert coding method 600 then determines whether the bus weight is less than half the number of lanes utilized (N/2) (decision block 606). If so, the data bus invert bit is set to "0" (block 608) and the bus bits are not inverted (block 610). If the weight is not less than half the number of lanes utilized (N/2), the data bus invert bit is set to "1" (block 612) and the bus bits are inverted (block 614).

Figure 7:
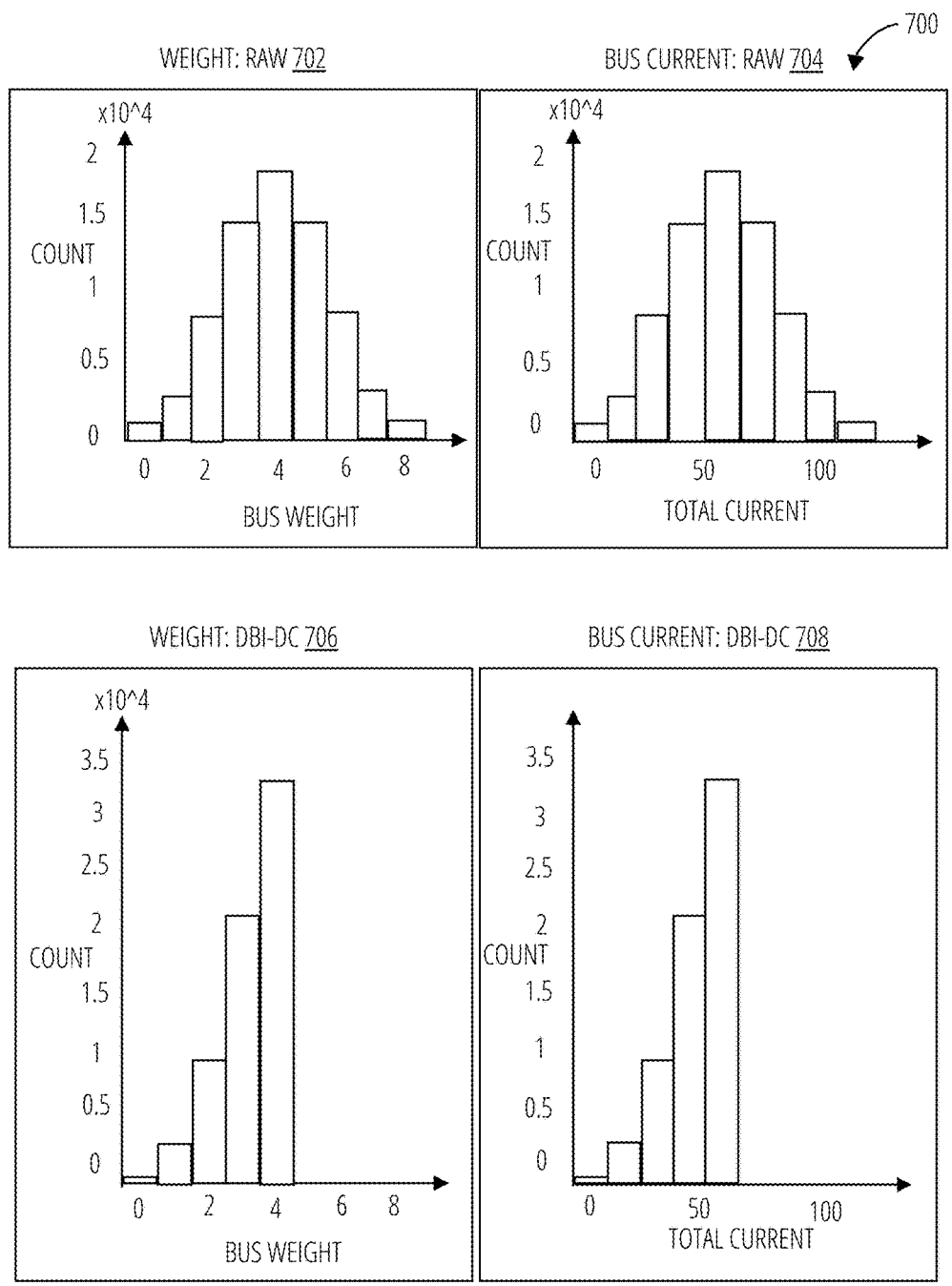
FIG. 7 illustrates an embodiment of histograms 700.

Referring to FIG. 7, histograms 700 depict bus weight and currents before low-weight coding, raw bus weights 702, raw bus currents 704, bus weight and currents after low-weight coding, DBI bus weights 706, and DBI bus currents 708. The raw bus weights 702 depict the bus weight for an 8-bit bus with normally distributed random data without encoding, while the DBI bus weights 706 depicts the case with low-weight (DBI-DC) encoding. The raw bus weights 702 have a maximum of 8, a minimum of 0, and a delta of 8. The DBI bus weights 706 have a maximum of 4, a minimum of 0, and a delta of 4. The bus weights of 5-8 have been "folded" down into the bus weights 1-4 in DBI bus weights 706 compared to raw bus weights 702. The raw bus currents 704 and the DBI bus currents 708 depict the total bus current for the same data. The raw bus currents 704 depict the case without encoding, and the DBI bus currents 708 depict the case with low-weight (DBI-DC) encoding. The raw bus currents 704 have a maximum of 120 mA, a minimum of 0 mA, an average of 60 mA, and a maximum di/dt of 120 mA. The DBI bus currents 708 have a maximum of 60 mA, a minimum of 0 mA, an average of 49 mA, and a maximum di/dt of 60 mA. The bus currents of 75-120 mA have been "folded" down into the bus currents of 15-60 mA. This reduces the maximum di/dt from 0-to-120 mA to 0-to-60 mA, and the average current is reduced from 60 mA to 49 mA or an 18.3% reduction in average current and power.

Figure 8:
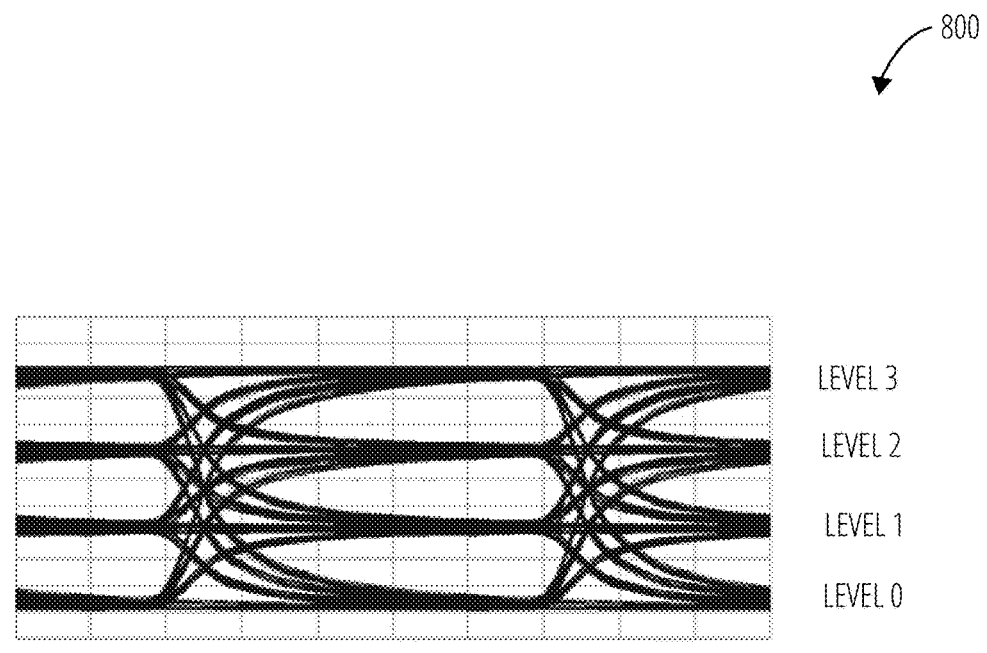
FIG. 8 illustrates an embodiment of pulse amplitude modulation eye diagrams 800.
Figure 8:
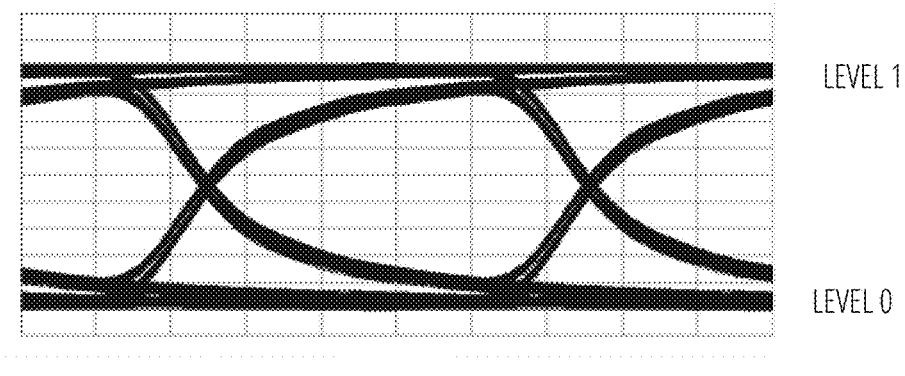
Figure 9:
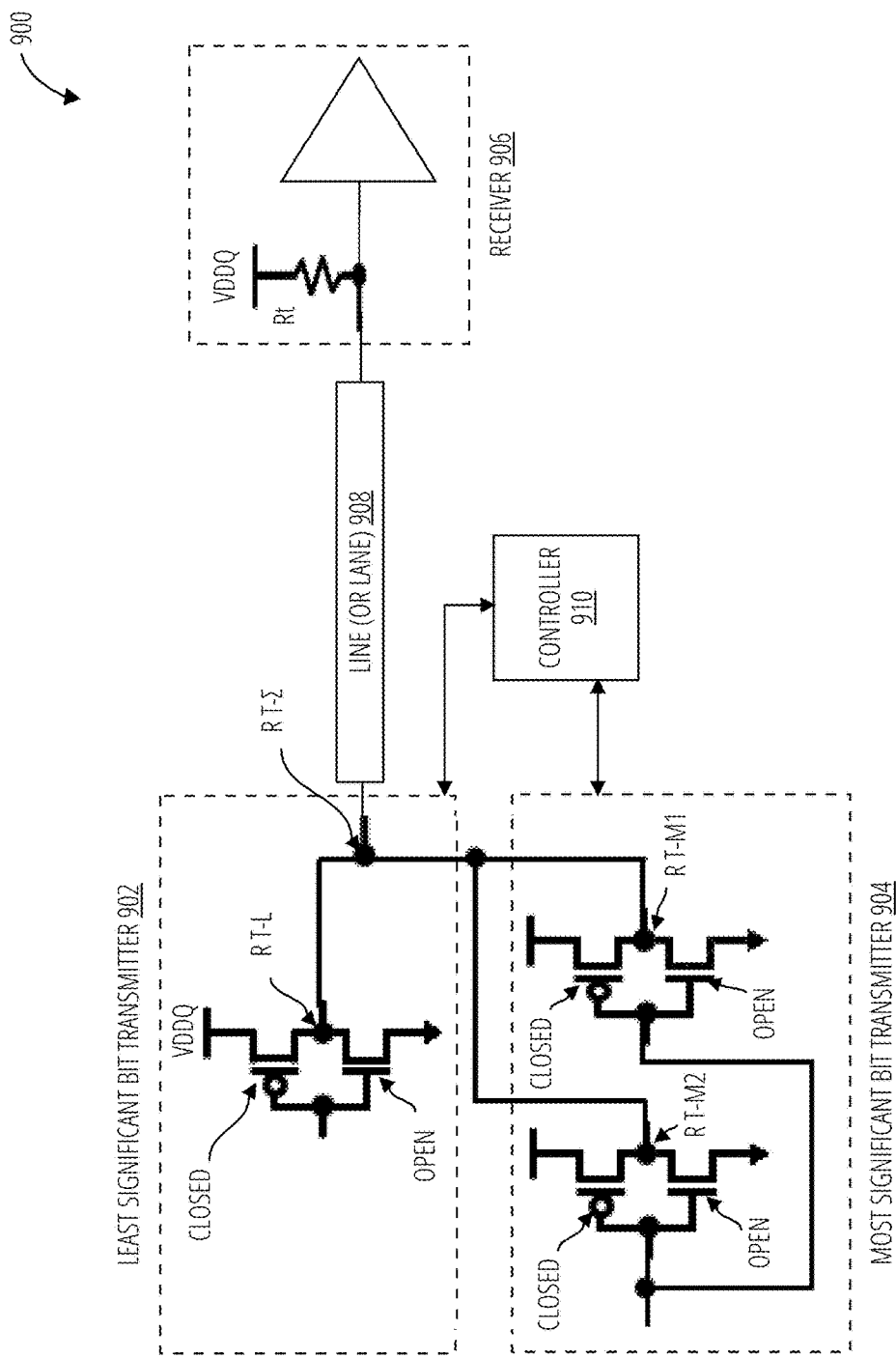
FIG. 9-12 illustrate an embodiment of a PAM-4 POD transmitter output state and receive termination 900.
Figure 10:
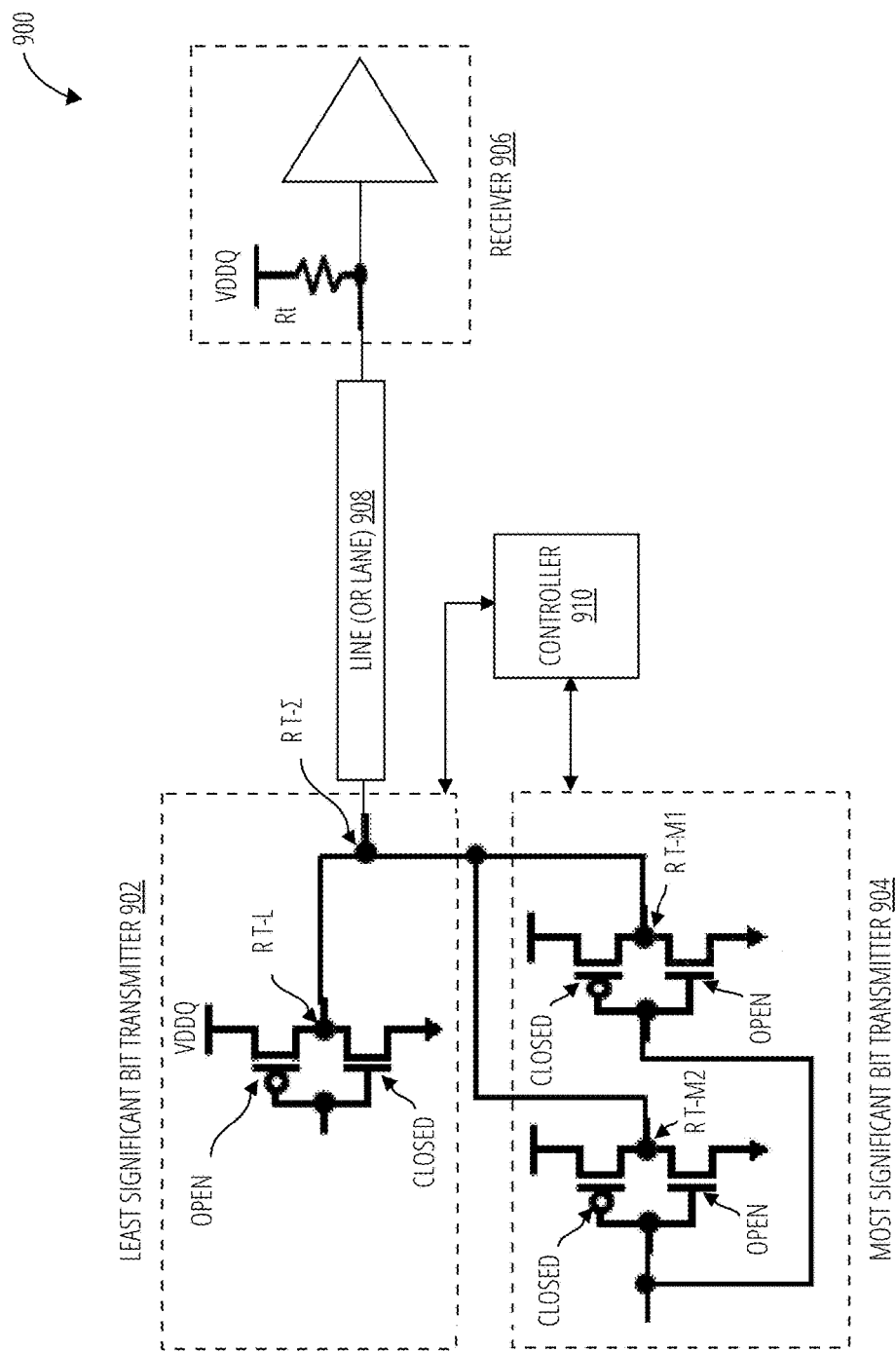
Figure 11:
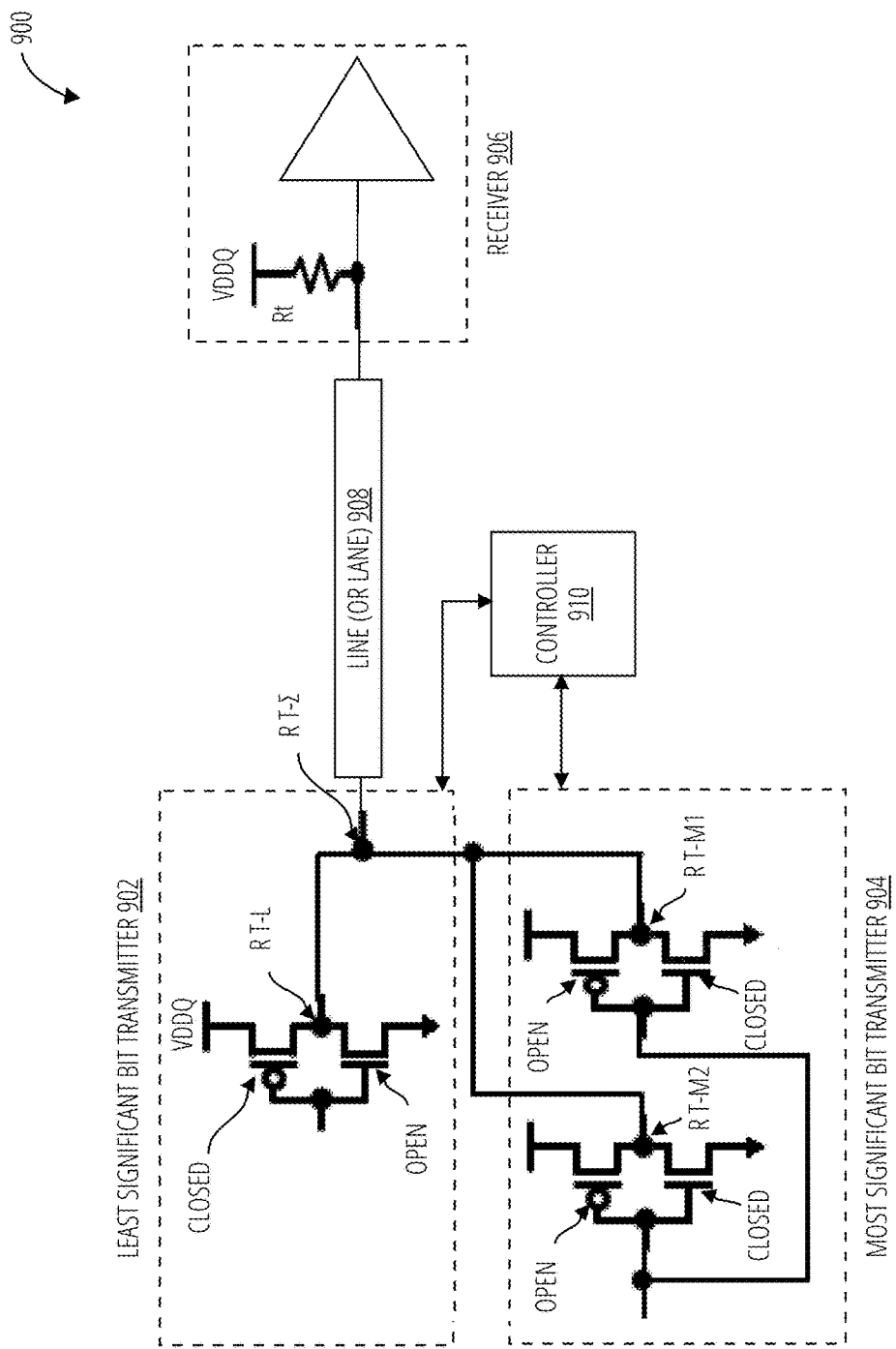
Figure 12:
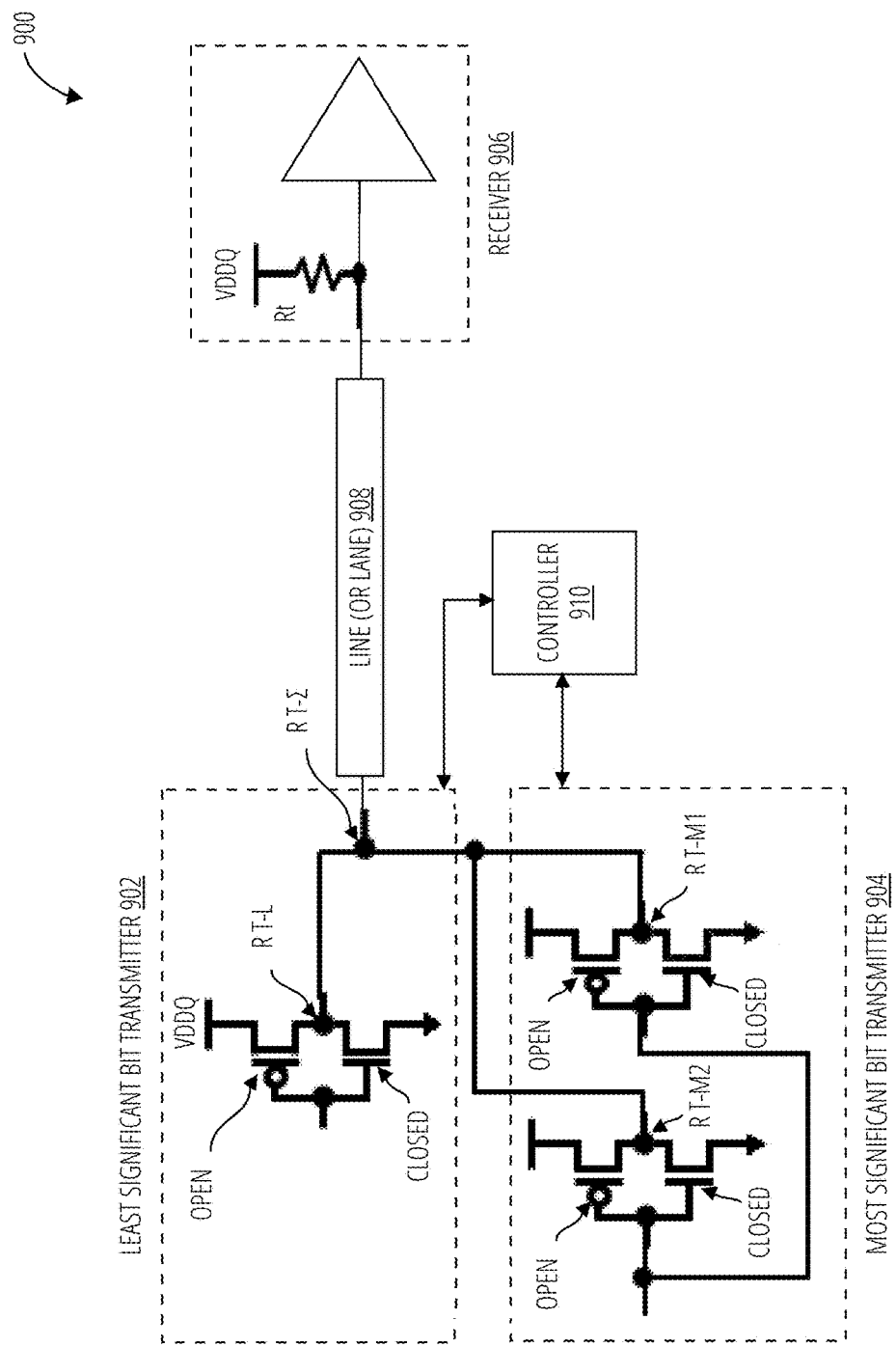

Referring to FIG. 8, pulse amplitude modulation eye diagrams 800 are shown for PAM-4 signaling 802 and for PAM-2 signaling 804. The PAM-4 signaling 802 is a link that communicates by transmitting four (4) distinct levels. Each level may be decomposed into contributions that represent the logical state of the information. Transmitting using four (4) distinct levels is often referred to as PAM-4 or PAM-4 signaling (PAM=Pulse Amplitude Modulation). Links that communicate using PAM-4 signaling send two (2) bits of information per symbol, where a symbol is one of four possible values of a bit pair. This is different from the type of signaling that is typically used for most parallel single-ended interfaces, as those may be limited to sending 1-bit per symbol (i.e., depicted by PAM-2 signaling 804 eye diagram). The PAM-4 signaling 802 and the PAM-2 signaling 804 eye diagrams plot the voltage on the line, usually at the receiver, against time, but the time axis is folded at a time interval equal to the clock period (2×UI). The signal has 4 levels with PAM-4 signaling and 2 levels with PAM-2 signaling. Each of these levels consumes a different amount of current. For example, as noted, the PAM-2 signaling system (depicted in FIG. 1-FIG. 3) consumes either 0 mA or 15 mA per lane.

Referring to FIG. 9-FIG. 12, a PAM-4 POD transmitter output state and receive termination 900 comprises a least significant bit transmitter 902, a most significant bit transmitter 904, a receiver 906, a line 908, and a controller 910. The PAM-4 POD transmitter output state and receive termination 900 may be in four (4) states based on the least significant bit transmitter 902 and the most significant bit transmitter 904. If the least significant bit transmitter 902 is LO and the most significant bit transmitter 904 is LO, then LSB=1 and MSB=1 on the line 908 and the line voltage is 1.2 V and line current is 0 mA. If the least significant bit transmitter 902 is HI and the most significant bit transmitter 904 is LO, then LSB=0 and MSB=1 on the line 908 and the line voltage is 1.0 V and line current is 5 mA. If the least significant bit transmitter 902 is LO and the most significant bit transmitter 904 is HI, then LSB=1 and MSB=0 on the line 908 and the line voltage is 0.8 V and line current is 10 mA. If the least significant bit transmitter 902 is HI and the most significant bit transmitter 904 is HI, then LSB=0 and MSB=0 on the line 908 and the line voltage is 0.6 V and line current is 15 mA.

The transmitter may be divided into three equally sized sections. One section (least significant bit transmitter 902) is driven with the LSB data and the other two sections (most significant bit transmitter 904) with the MSB data. Each section is designed to have a pull-up and pull-down resistance of 120Ω. In some embodiments, as there are three sections and each section is always activated, either in a pull-up or pull-down state, the overall equivalent resistance is 40Ω, which is commonly utilized for graphics memory interfaces. FIG. 9-FIG. 12 depict how a PAM-4 POD driver would be constructed and driven to create equal voltage amplitude signals at the receiver, with the current drawn through the line from the $V_{DDQ}$ power supply at the receiver: 0 mA, 5 mA, 10 mA, and 15 mA, respectively.

The least significant bit transmitter 902 consumes either 0 mA or 5 mA, per lane. Therefore, the value of 5 mA is assigned for the least significant bit transmitter 902 to have a weight of 1, per lane. The most significant bit transmitter 904 consumes either 0 mA or 10 mA per lane. As the least significant bit transmitter 902 was assigned a weight of 1 for 5 mA, a value of 10 mA is assigned to have a weight of 2, per lane. The 8 lanes utilizing the PAM-4 signaling in FIG. 9-FIG. 12 may have a total weight that ranges from 0 to 24, which equates to a current range 0 to 120 mA (i.e., 24×5 mA=120 mA). The controller 910 determines whether to invert the polarity of the least significant bit transmitter 902 and the most significant bit transmitter 904 based on the weights. Inversion methods are depicted in FIG. 14 and listed in the Listings.

Figure 13:
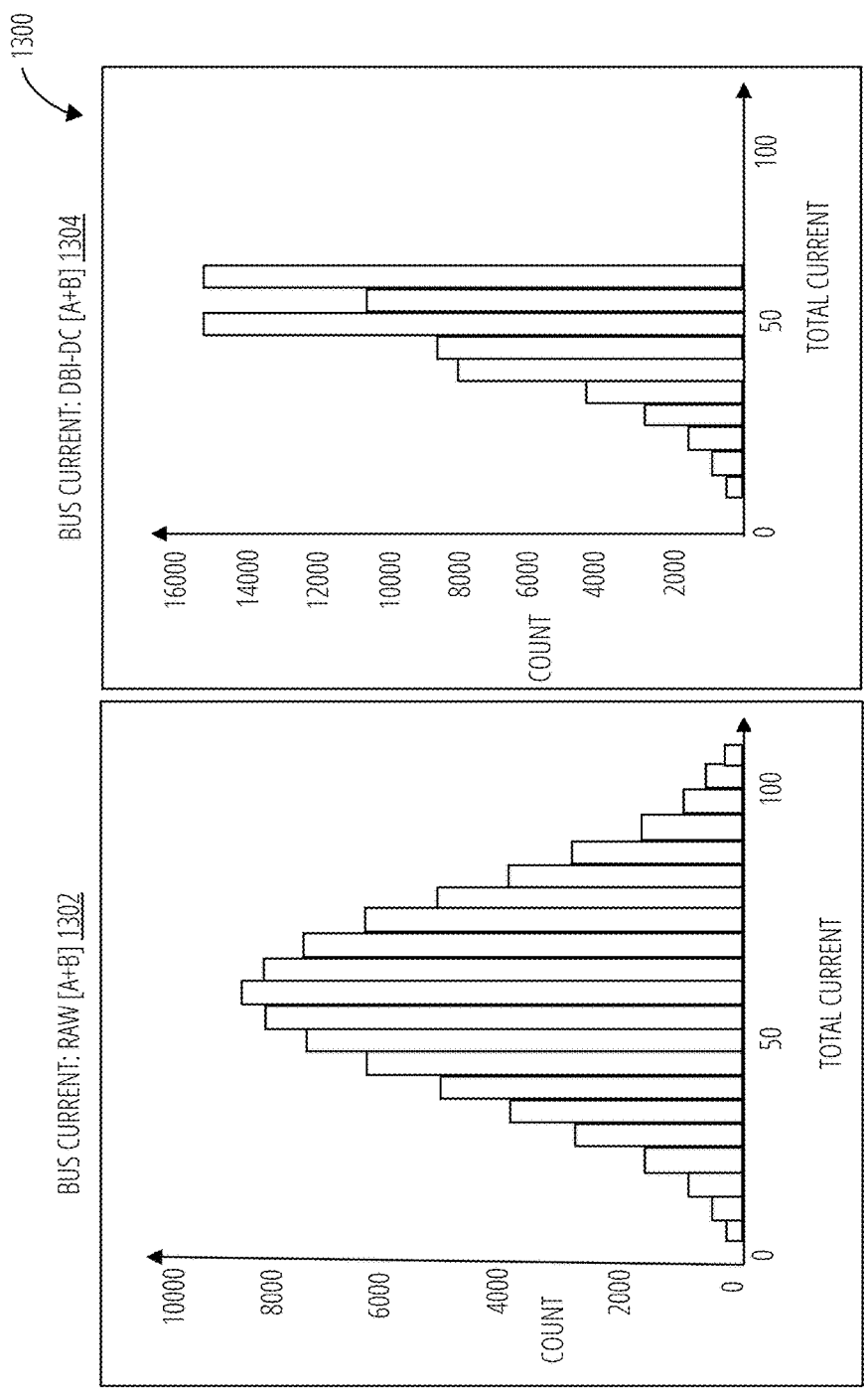
FIG. 13 illustrates an embodiment of histograms 1300.

Referring to FIG. 13, histograms 1300 depicts raw bus currents 1302 before low-weight coding is applied independently to LSB & MSB bits and DBI bus currents 1304 after low-weight coding was applied independently to LSB & MSB bits. The histograms 1300 depicts the PAM-4 POD transmitter utilizing the low-weight encoding algorithm described in FIG. 6, independently for both LSB bit (output driver) and MSB bit (output driver). The raw bus currents 1302 may have an average of 60 mA, a maximum of 120 mA, a minimum of 0 mA, and a maximum di/dt of 120 mA. The DBI bus currents 1304 may have an average of 49 mA, a maximum of 60 mA, a minimum of 0 mA, and a maximum di/dt of 60 mA. A 50% reduction in maximum di/dt may thus be obtained. This also results in the 18.3% reduction in average current and power.

Figure 14:
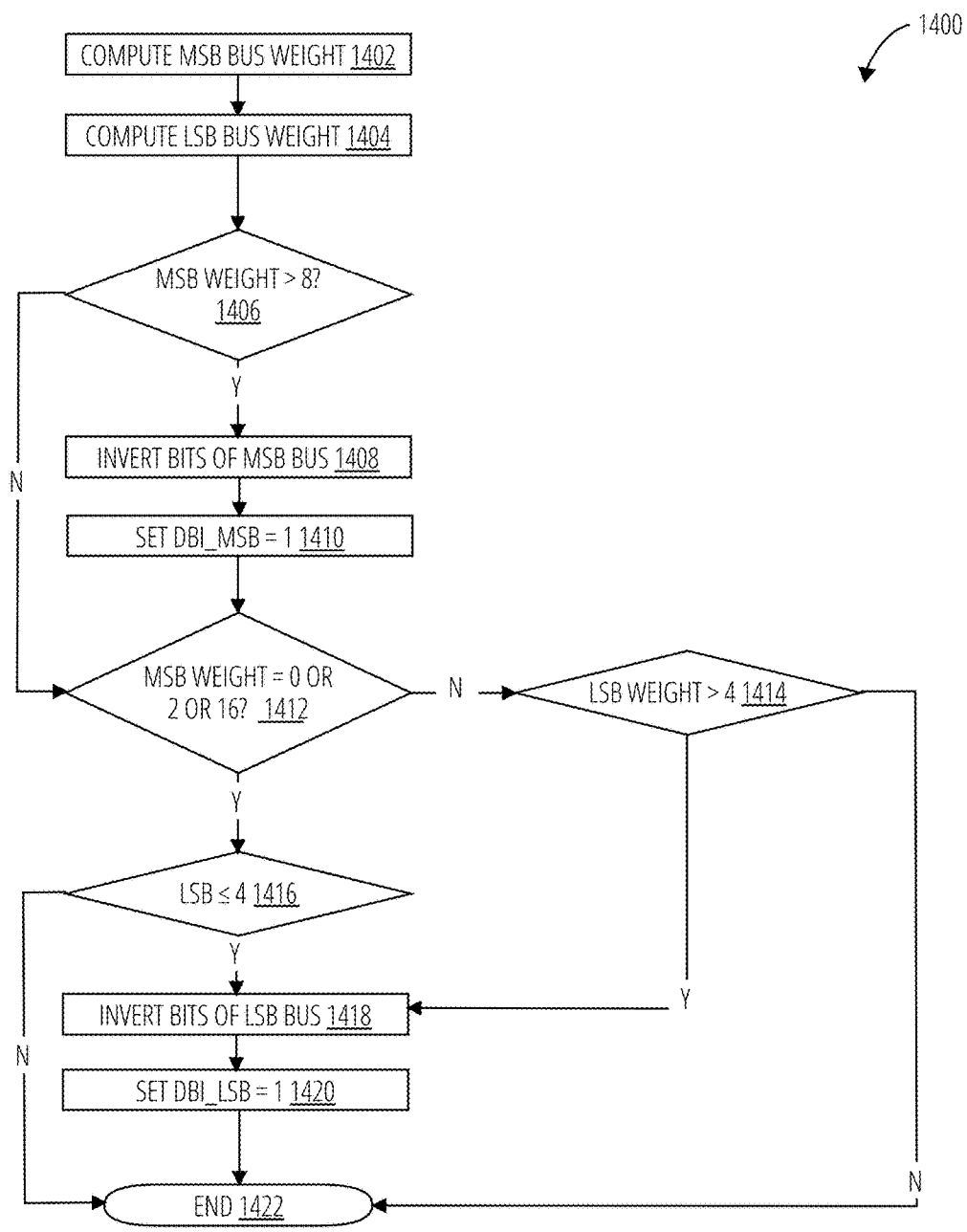
FIG. 14 illustrates an embodiment of a bus-invert coding method 1400.

Referring to FIG. 14, a bus-invert coding method 1400 considers the weight of the MSB bits ("MSB bus") before determining whether to encode the LSB bits ("LSB bus"). The bus-invert coding method 1400 may reduce the maximum di/dt by 67% and maintain essentially the same reduction in current/power. The range of the total bus weight is restricted by considering the interaction of the LSB and MSB bits and their combined possible states. In one embodiment, the MSB weight ranges from 0-to-16 by 2 and the LSB weight ranges from 0-to-8 by 1. The bus-invert coding method 1400 computes the MSB bus weight (block 1402). The LSB bus weight is also computed (block 1404). The bus-invert coding method 1400 determines whether the MSB weight is greater than 8 (decision block 1406). If so, the MSB bus bits are inverted (block 1408) and the DBI MSB is set to "1" (block 1410). Once complete or if the MSB weight is not greater than 8, the bus-invert coding method 1400 determines whether the MSB weight is 0 or 2 or 16, prior to inversion, based on block 1408 (decision block 1412). If not, the bus-invert coding method 1400 determines whether the LSB weight is greater than 4 (decision block 1414). If so, the bus-invert coding method 1400 determines whether the LSB weight is less than or equal to 4 (decision block 1416).

If the MSB weight is not 0, 2, or 16 and the LSB is greater than 4 or the MSB weight is 0, 2, or 16 and the LSB is less than or equal to 4, the LSB bus bits are inverted (block 1418) and the DBI_LSB is set to "1" (block 1420). The bus-invert coding method 1400 ends at done block 1422.

A second explanation of the algorithm could also be described as: 1) If the weight of the bits of the MSB portions of the symbols on the bus>8, then invert the polarity of all MSB bits and set DBI MSB=1; 2) If the weight of the bits of the LSB portion of the symbols on the bus>4 and if the weight of the bits of the MSB portion of the bus is from 4 to 14 (inclusive), then invert the polarity of all LSB bits and set DBI_LSB=1; 3) Then, if the weight of the bits of the MSB portion of the bus=0 or 2 or 16 and the weight of the LSB portion of the bus≤4, invert all the bits of the LSB portion of the symbols and set DBI_LSB=1; 4) For any other cases, no bits get inverted and both DBI MSB=0 & DBI_LSB=0.

In various embodiments then, a first weight is applied valued between 0 and 16 inclusive in increments of 2, and each of the lanes at a first current level contributes 0 to the first weight and each data lane at a second current level contributes 2 to the first weight. A second weight is also applied, valued between 0 and 8 inclusive in increments of 1, and each of the lanes at a third current level contributes 0 to the second weight and each of the data lanes at a fourth current level contributes 1 to the second weight. The most significant bits are inverted if the first weight is greater than 8, and the least significant bits are inverted if the first weight is 0, 2, or 16 and the second weight is less than or equal to 4, or the first weight is between 4 and 14 inclusive, and the second weight is greater than 4.

The controller may perform additional checking for subcases on the least significant bits, for example inverting the least significant bits if (a) the total first weight is 0 and the total second weight is 5 or (b) the total first weight is 2 or 16 and the total second weight is between 5 and 7 inclusive, and not inverting the least significant bits if (a) the total first weight is 0 and the total second weight is 4 or (b) the total first weight is 2 or 16 and the total second weight is between 2 and 4 inclusive.

In another example the first weight is between 0 and 16 inclusive in increments of 2, with each of the lanes at the first current level contributing 0 to the first weight and at the second current level contributing 2 to the first weight. The second weight is between 0 and 8 inclusive in increments of 1, with each of the lanes at the third current level contributing 0 to the second weight and at the fourth current level contributing 1 to the second weight. The most significant bits are inverted if the first weight plus the second weight is greater than or equal to 14, and the least significant bits are inverted if the first weight plus the second weight is (a) less than 5 or (b) between 14 and 22 inclusive.

Figure 15:
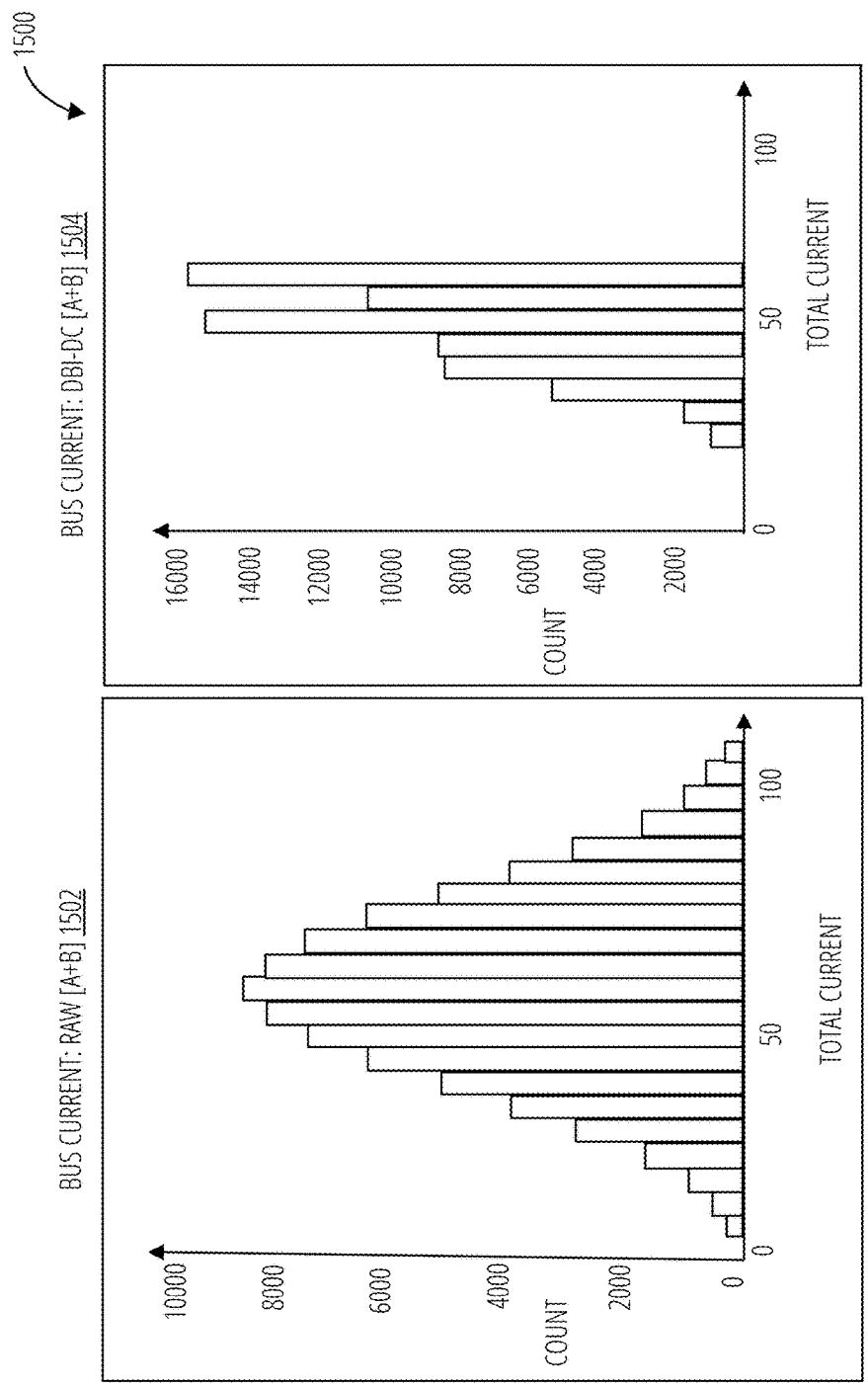
FIG. 15 illustrates an embodiment of histograms 1500.

Referring to FIG. 15, histograms 1500 depicts raw bus currents 1502 and DBI bus currents 1504 prior to and after applying the method depicted in FIG. 14, respectively. The raw bus currents 1502 may have an average of 60 mA, a maximum of 120 mA, a minimum of 0 mA, and a maximum di/dt of 120 mA. The DBI bus currents 1504 may have an average of 49.5 mA, a maximum of 60 mA, a minimum of 20 mA, and a maximum di/dt of 40 mA. A 50% reduction in maximum di/dt may thus be obtained. This also results in the 18.3% reduction in average current and power. The bus-invert coding method 1400 is "folding" the cases that would otherwise create combined MSB+LSB bus weights from 0-to-3 (0-to-15 mA), up and into other already possible states with a weight range from 5-to-12 (25-to-60 mA). This reduces the maximum di/dt from 0-to-60 mA to 20-to-60 mA, which is 40 mA or 67% less than the un-encoded range of 0-to-120 mA.

There are other possible encoding techniques, but this approach may achieve the minimum possible di/dt without limiting the possible states of each individual signal. It can also be performed by using the pre-exiting low-weight encoding logic with the simple inclusion of the case that checks for the combined exception case/step #3 from the second explanation of the algorithm. This method utilizes no special look-up tables and no additional overhead temporally (that is, running the link faster than the baseline signaling rate) or additional signal wires. The decoding also works with a receiver device that is unaware of the algorithm being used at the transmitter. This is the case because all decoding information is conveyed with the polarity of the DBI bits. Therefore, it can be use with a GPU and a DRAM that do not support this encoding when transmitting information. It can be used in one or both directions for the link.

Figure 16:
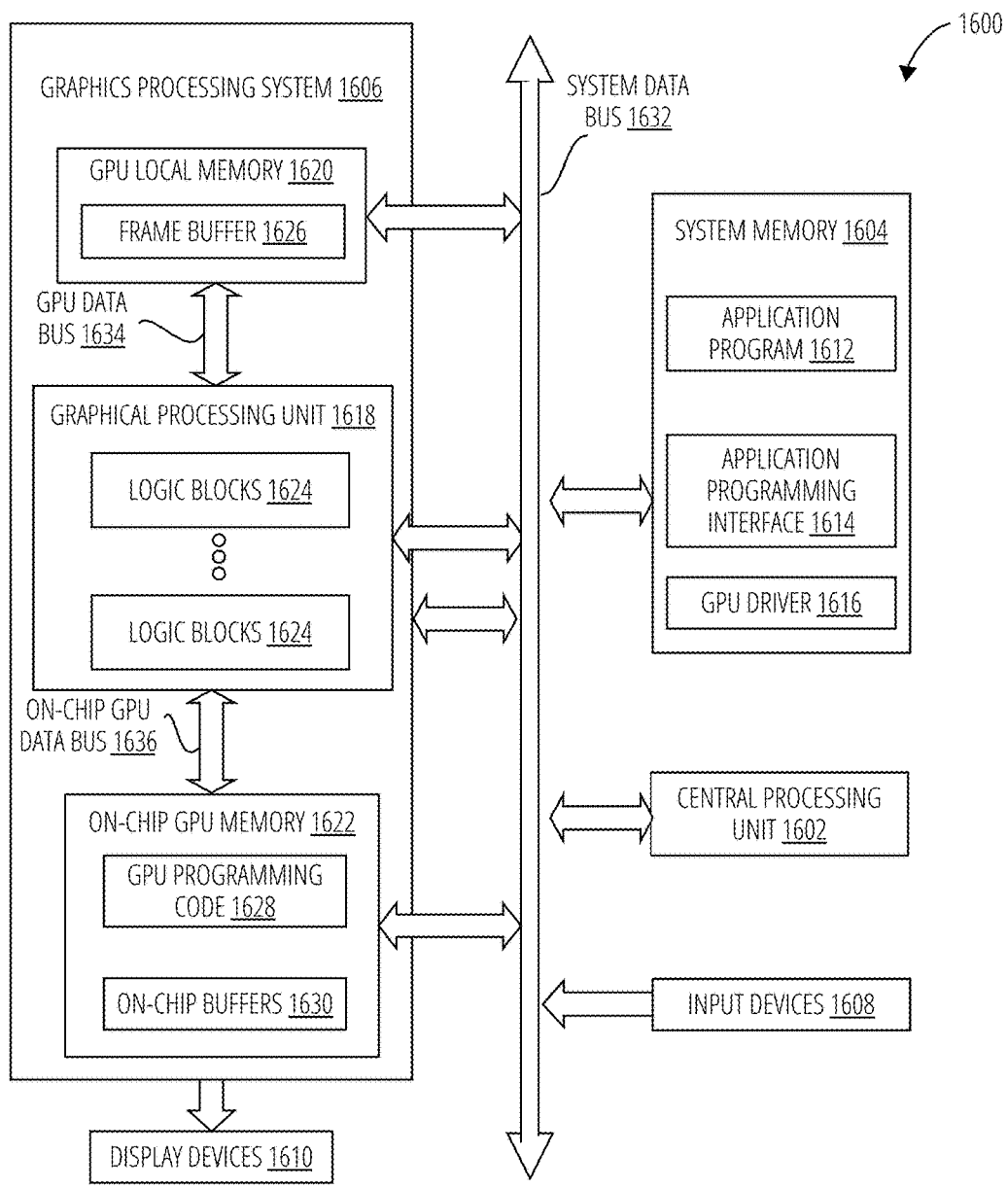
FIG. 16 is a block diagram of a computing system 1600 within which the techniques introduced herein may be embodied or carried out.

FIG. 16 is a block diagram of one embodiment of a computing system 1600 in which one or more aspects of the disclosure may be implemented. The computing system 1600 includes a system data bus 1632, a CPU 1602, input devices 1608, a system memory 1604, a graphics processing system 1606, and display devices 1610. In alternate embodiments, the CPU 1602, portions of the graphics processing system 1606, the system data bus 1632, or any combination thereof, may be integrated into a single processing unit. Further, the functionality of the graphics processing system 1606 may be included in a chipset or in some other type of special purpose processing unit or co-processor.

As shown, the system data bus 1632 connects the CPU 1602, the input devices 1608, the system memory 1604, and the graphics processing system 1606. In alternate embodiments, the system memory 1604 may connect directly to the CPU 1602. The CPU 1602 receives user input from the input devices 1608, executes programming instructions stored in the system memory 1604, operates on data stored in the system memory 1604 to perform computational tasks. The system memory 1604 typically includes dynamic random-access memory (DRAM) employed to store programming instructions and data. The graphics processing system 1606 receives instructions transmitted by the CPU 1602 and processes the instructions, for example to implement aspects of the disclosed embodiments, and/or to render and display graphics (e.g., images, tiles, video) on the display devices 1610.

As also shown, the system memory 1604 includes an application program 1612, an API 1614 (application programming interface), and a graphics processing unit driver 1616 (GPU driver). The application program 1612 generates calls to the API 1614 to produce a desired set of computational results. For example, the application program 1612 may transmit programs or functions thereof to the API 1614 for processing within the graphics processing unit driver 1616.

The graphics processing system 1606 includes a GPU 1618 (graphics processing unit), an on-chip GPU memory 1622, an on-chip GPU data bus 1636, a GPU local memory 1620, and a GPU data bus 1634. The GPU 1618 is configured to communicate with the on-chip GPU memory 1622 via the on-chip GPU data bus 1636 and with the GPU local memory 1620 via the GPU data bus 1634. The GPU 1618 may receive instructions transmitted by the CPU 1602, process the instructions, and store results in the GPU local memory 1620. Subsequently, the GPU 1618 may display certain graphics stored in the GPU local memory 1620 on the display devices 1610.

The GPU 1618 includes one or more logic blocks 1624. The logic blocks 1624 may implement embodiments of the systems and techniques disclosed herein.

The disclosed embodiments may be utilized to communicate data between various components of the computing system 1600. Exemplary component communications include between the CPU 1602 and/or the GPU 1618 and the memory circuits, including the system memory 1604, the GPU local memory 1620, and/or the on-chip GPU memory 1622.

The GPU 1618 may be provided with any amount of on-chip GPU memory 1622 and GPU local memory 1620, including none, and may employ on-chip GPU memory 1622, GPU local memory 1620, and system memory 1604 in any combination for memory operations.

The on-chip GPU memory 1622 is configured to include GPU programming 1628 and on-Chip Buffers 1630. The GPU programming 1628 may be transmitted from the graphics processing unit driver 1616 to the on-chip GPU memory 1622 via the system data bus 1632. The GPU programming 1628 may include the logic blocks 1624.

The GPU local memory 1620 typically includes less expensive off-chip dynamic random-access memory (DRAM) and is also employed to store data and programming employed by the GPU 1618. As shown, the GPU local memory 1620 includes a frame buffer 1626. The frame buffer 1626 may for example store data for example an image, e.g., a graphics surface, that may be employed to drive the display devices 1610. The frame buffer 1626 may include more than one surface so that the GPU 1618 can render one surface while a second surface is employed to drive the display devices 1610.

The display devices 1610 are one or more output devices capable of emitting a visual image corresponding to an input data signal. For example, a display device may be built using a liquid crystal display, or any other suitable display system. The input data signals to the display devices 1610 are typically generated by scanning out the contents of one or more frames of image data that is stored in the frame buffer 1626.

Terms used herein should be accorded their ordinary meaning in the relevant arts, or the meaning indicated by their use in context, but if an express definition is provided, that meaning controls.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

"Firmware" refers to software logic embodied as processor-executable instructions stored in read-only memories or media.

"Hardware" refers to logic embodied as analog or digital circuitry.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter). The disclosed techniques may be embodied by circuits, firmware, and software in various combinations, according to the requirements of the particular implementation.

"Software" refers to logic implemented as processor-executable instructions in a machine memory (e.g. read/write volatile or nonvolatile memory or media).

"Weight" refers to a scaling factor associated with one of a set of numerical quantities, used to represent its influence relative to the other members of the set.

"Bus" refers to a distinct set of conductors carrying data and control signals within a computer system, to which pieces of equipment may be connected in parallel. Each of the conductors may be referred to lines or lanes.

Herein, references to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

Code Listings

The following code listings are examples of logic to implement aspects of the invention disclosed herein.

% data1 is the LSB data
% data2 is the MSB data

Listing i

```
for R = 1:length(data1_dbi_mp)
  if weight_data2mp_raw(R) > 8
    data2_dbi_mp(R, :) = not(data2_dbi_mp(R, :) );
    dbi_mp_bit2(R) = 1;
  end
```

Listing i

```
end
for R = 1:length(data1_dbi_mp)
  if (weight_data2mp_raw(R) == 0 | | weight_data2mp_raw(R) == 2 | |
weight_data2mp_raw(R) == 16) && weight_data1mp raw(R) <= 4
    data1_dbi_mp(R, :) = not(data1_dbi_mp(R, :) );
    dbi_mp_bit1(R) = 1;
  elseif not(weight_data2mp_raw(R) == 0 | | weight_data2mp_raw(R)
== 2 | | weight_data2mp_raw(R) ==16) && weight_data1mp_raw(R) > 4
    data1_dbi_mp(R, :) = not(data1_dbi_mp(R, :) );
    dbi_mp_bit1(R) = 1;
  end
end
```

Listing ii

```
for R = 1:length(data1_dbi_mp);
  if (weight_data2mp_raw(R) == 0 | | weight_data2mp_raw(R) == 2 | |
weight_data2mp_raw(R) == 16) && weight_data1mp_raw(R) <= 4
    data1_dbi_mp (R, : ) = not (data1_dbi_mp (R, : ) ) ;
    dbi_mp_bit1 (R) = 1;
  elseif not (weight_data2mp_raw (R) == 0 | | weight_data2mp_raw (R)
== 2 | | weight_data2mp_raw (R) == 16) && weight_data1mp_raw (R)
> 4
    data1_dbi_mp (R, : ) = not (data1_dbi_mp (R, : ) ) ;
    dbi_mp_bit1 (R) = 1;
  elseif weight_data1mp_raw (R) == 4 && weight_data2mp_raw (R) == 0;
    data1_dbi_mp (R, : ) = data1_dbi_mp (R, : ) ;
    dbi_mp_bit1 (R) = 0;
  elseif weight_data1mp_raw (R) == 5 && weight_data2mp_raw (R) == 0;
    data1_dbi_mp (R, : ) = not (data1_dbi_mp (R, : ) ) ;
    dbi_mp_bit1 (R) = 1;
  elseif weight_data1mp_raw (R) >= 2 && weight_data1mp_raw (R) <= 4
&& (weight_data2mp_raw (R) == 2 | | weight_data2mp_raw (R) == 16) ;
    data1_dbi_mp (R, : ) = data1_dbi_mp (R, : ) ;
    dbi_mp_bit1 (R) = 0;
  elseif weight_data1mp raw (R) >=5 && weight_data1mp_raw (R) <= 7
&& (weight_data2mp_raw (R) == 2 | | weight_data2mp_raw (R) == 16) ;
    data1_dbi_mp (R, : ) = not (data1_dbi_mp (R, : ) ) ;
    dbi_mp_bit1 (R) = 1;
  end;
end;
```

What is claimed is:

1. A system comprising:
   a PAM-4 transmitter coupled to one or more lanes, the PAM-4 transmitter comprising, for each of the lanes:
     a most significant bit output operable at a first current level or a second current level on a corresponding data lane; and
     a least significant bit output operable at a third current level or a fourth current level on the corresponding data lane; and
   a controller coupled to the PAM-4 transmitter to:
     determine a state of the PAM-4 transmitter, the state comprising a first weight for first bits from the most significant bit outputs for the lanes, and a second weight for second bits from the least significant bit outputs for the lanes; and
     selectively invert the first bits based on the first weight, and dependent on the first weight and further dependent on the second weight, selectively invert the second bits.

2. The system of claim 1, wherein the state of the PAM-4 transmitter comprises:
   the first weight between 0 and 16 inclusive in increments of 2, each of the lanes at the first current level contributing 0 to the first weight and at the second current level contributing 2 to the first weight; and the second weight between 0 and 8 inclusive in increments of 1, each lane at the third current level contributing 0 to the second weight and at the fourth current level contributing 1 to the second weight;

wherein the first bits are inverted if the first weight is greater than 8;

wherein the second bits are inverted if:
the first weight is 0, 2, or 16 and the second weight is less than or equal to 4; or
the first weight is between 4 and 14 inclusive, and the second weight is greater than 4.

3. The system of claim 2, wherein the controller is configured to perform additional checking for sub-cases on the second bits, the sub-cases comprising:
inverting the second bits if (a) the first weight is 0 and the second weight is 5 or (b) the first weight is 2 or 16 and the second weight is between 5 and 7 inclusive; and
not inverting the second bits if (a) the first weight is 0 and the second weight is 4 or (b) the first weight is 2 or 16 and the second weight is between 2 and 4 inclusive.

4. The system of claim 1, wherein the state of the PAM-4 transmitter comprises:
the first weight between 0 and 16 inclusive in increments of 2, each of the lanes at the first current level contributing 0 to the first weight and at the second current level contributing 2 to the first weight; and
the second weight between 0 and 8 inclusive in increments of 1, each of the lanes at the third current level contributing 0 to the second weight and at the fourth current level contributing 1 to the second weight;
wherein the first bits are inverted if the first weight plus the second weight is greater than or equal to 14;
wherein the second bits are inverted if the first weight plus the second weight is (a) less than 5 or (b) between 14 and 22 inclusive.

5. The system of claim 1, wherein the first bits are inverted independently of the second bits.

6. The system of claim 1, wherein the one or more lanes comprise eight data lanes.

7. The system of claim 1, wherein the one or more lanes comprise a data bus invert lane to:
transmit a first polarity-indicating bit with a first value based on whether the first bits are inverted; and
transmit a second polarity-indicating bit with a second value based on whether the second bits are inverted.

8. The system of claim 7, wherein the first polarity-indicating bit and the second polarity-indicating bit configure a receiver to invert or not invert the first bits and the second bits received at the receiver.

9. The system of claim 7, wherein:
the first value is:
0, if the first bits are not inverted; and
1, if the first bits are inverted; and
the second value is:
0, if the second bits are not inverted; and
1, if the second bits are inverted.

10. The system of claim 1, wherein the most significant bit outputs and the least significant bit outputs are configured such that the second current level is twice the fourth current level.

11. A method comprising:
determining a most significant bit weight for data transmitted on a PAM-4 bus, the bus having one or more lanes, based on a most significant bit output operating at a first current level or a second current level;

determining a least significant bit weight for the data transmitted on the PAM-4 bus based on a least significant bit output operating at a third current level or a fourth current level;
selectively inverting a polarity of the most significant bit output based on the most significant bit weight; and
dependent on the most significant bit weight and further dependent on the least significant bit weight, selectively inverting a polarity of the least significant bit output.

12. The method of claim 11, further comprising:
determining the most significant bit weight to fall between 0 and 16 inclusive in increments of 2, each of the one or more lanes of the bus at the first current level contributing 0 and at the second current level contributing 2 to the most significant bit weight; and
determining the least significant bit weight to fall between 0 and 8 inclusive in increments of 1, each of the one or more lanes at the third current level contributing 0 and at the fourth current level contributing 1 to the least significant bit weight;
inverting the polarity of the most significant bit output of each of the lanes if the most significant bit weight is greater than 8; and
inverting the polarity of the least significant bit output of each of the lanes if:
the most significant bit weight is 0, 2, or 16 and the least significant bit weight is less than or equal to 4; or
the most significant bit weight is between 4 and 14 inclusive, and the least significant bit weight is greater than 4.

13. The method of claim 12, further comprising performing additional checking for sub-cases on the least significant bit output, the sub-cases comprising:
inverting the least significant bit output if (a) the most significant bit weight is 0 and the least significant bit weight is 5 or (b) the most significant bit weight is 2 or 16 and the least significant bit weight is between 5 and 7 inclusive; and
not inverting the least significant bit output if (a) the most significant bit weight is 0 and the least significant bit weight is 4 or (b) the most significant bit weight is 2 or 16 and the least significant bit weight is between 2 and 4 inclusive.

14. The method of claim 11, further comprising:
determining the most significant bit weight to fall between 0 and 16 inclusive in increments of 2, each of the lanes at the first current level contributing 0 to the most significant bit weight and at the second current level contributing 2 to the most significant bit weight;
determining the least significant bit weight to fall between 0 to 8 inclusive in increments of 1, each of the lanes at the third current level contributing 0 to the least significant bit weight and at the fourth current level contributing 1 to the least significant bit weight;
inverting the polarity of the most significant bit section if the most significant bit weight plus the least significant bit weight is greater than or equal to 14; and
inverting the polarity of the least significant bit section if the most significant bit weight plus the least significant bit weight is (a) less than 5 or (b) between 14 and 22 inclusive.

15. The method of claim 11, wherein the polarity of the most significant bit output is inverted independently of the polarity of the least significant bit output.

16. The method of claim 11, wherein the one or more lanes comprise eight data lanes.

17. The method of claim 11, wherein the one or more lanes comprise a data bus invert lane to:
- transmit a first polarity-indicating bit with a first value based on whether the polarity of the most significant bit output is inverted; and
- transmit a second polarity-indicating bit with a second value based on whether the polarity of the least significant bit output is inverted.

18. The method of claim 17, wherein the first polarity-indicating bit and the second polarity-indicating bit configure a receiver to invert or not invert first bits associated with the most significant bit output and second bits associated with the least significant bit output, respectively, received from the bus.

19. The method of claim 17, wherein:
the first value is:
- 0, if the polarity of the most significant bit output is not inverted; and
- 1, if the polarity of the most significant bit output is inverted; and the second value is:
- 0, if the polarity of the least significant bit output is not inverted; and
- 1, if the polarity of the least significant bit output is inverted.

20. The method of claim 11, wherein the most significant bit output and the least significant bit output are configured such that the second current level is twice the fourth current level.

* * * * *